United States Patent

Hand

[19]

[11] Patent Number: 5,923,867
[45] Date of Patent: Jul. 13, 1999

[54] OBJECT ORIENTED SIMULATION MODELING

[75] Inventor: Charles Hand, San Jose, Calif.

[73] Assignee: Adaptec, Inc., Milpitas, Calif.

[21] Appl. No.: 08/903,803

[22] Filed: Jul. 31, 1997

[51] Int. Cl.$^6$ ...................................................... G06F 9/45
[52] U.S. Cl. ......................... 395/500; 395/704; 395/708; 364/578; 707/103
[58] Field of Search .................................... 395/500, 551, 395/702, 704, 705, 708; 364/578, 489, 490; 707/103

[56] References Cited

U.S. PATENT DOCUMENTS

| | | | |
|---|---|---|---|
| 4,821,220 | 4/1989 | Duisberg | 364/578 |
| 4,965,743 | 10/1990 | Malin et al. | 364/513 |
| 5,220,512 | 6/1993 | Watkins et al. | 364/489 |
| 5,640,546 | 6/1997 | Gopinath et al. | 395/551 |
| 5,732,192 | 3/1998 | Malin et al. | 395/10 |

*Primary Examiner*—Kevin J. Teska
*Assistant Examiner*—Thai Phan
*Attorney, Agent, or Firm*—Martine Penilla & Kim, LLP

[57] ABSTRACT

A process for object oriented simulation modeling for electronic circuits includes executing at least one setup file for object oriented simulation of an electronic circuit to create at least one object call. Subsequent object calls take precedence over earlier object calls. A compiler receives the sequence of object calls along with an output of an interface generator. The compiler produces a master file including a plurality of models interconnected by a plurality of interfaces. Each of the interfaces includes at least one parameter such that a modification to a parameter of an interface carries through to each model to which it is connected. The master file may be stored in a single directory of read/write memory of a computer system. Finally, a testbench simulator is executed using the master file to simulate the operation of electronic circuitry.

20 Claims, 9 Drawing Sheets

C:/DIR1/DUT

C:/DIR2/MODULE1

C:/DIR2/SUB1/MODULE2

C:/DIR3/MACROS

C:/DIR1

|  | W0 | W1 | W2 | W3 | W4 | W5 | W6 | W7 | W(N-1) |
|---|---|---|---|---|---|---|---|---|---|
| INTERFACE 0 | X | X |  | X |  |  |  |  |  |
| INTERFACE 1 |  |  | X |  | X |  |  |  |  |
| INTERFACE 2 |  |  |  |  |  | X | X | X |  |

OBJECT ORIENTED SIMULATION MODELING

TECHNICAL FIELD

This invention relates generally to simulation of electronic circuits using a computer-implemented simulator and more specifically to an object oriented approach to managing a virtual test bench for simulation of electronic circuits.

BACKGROUND OF THE INVENTION

For purposes of designing and testing an electronic circuit, it is useful to simulate performance of the electronic circuit. Simulation of an electronic circuit may be accomplished using a simulation program implemented by a computer system. Such simulation programs are particularly useful in simulating performance of semiconductor integrated circuits including application specific integrated circuits (ASIC's). One example of several commercially available simulation programs is Verilog-XL available from Cadence corporation of Mountain View, Calif. Another example of a simulation program is a VCS simulator available from Chronologic Corporation.

Simulators are commonly employed to simulate performance of an electronic circuit as coupled to other external devices such as, for example, an extension bus of a computer. A virtual test bench is a simulation construction including simulation models of a device under test (DUT) and simulation models of external devices with which the DUT interfaces. A Verilog-XL simulator may be used for effecting simulation of a virtual test bench wherein the virtual test bench is described by a hardware description language. On example of a hardware description language is the Verilog hardware description language which is commonly used to describe a test bench for input to a simulator.

Figure 1:
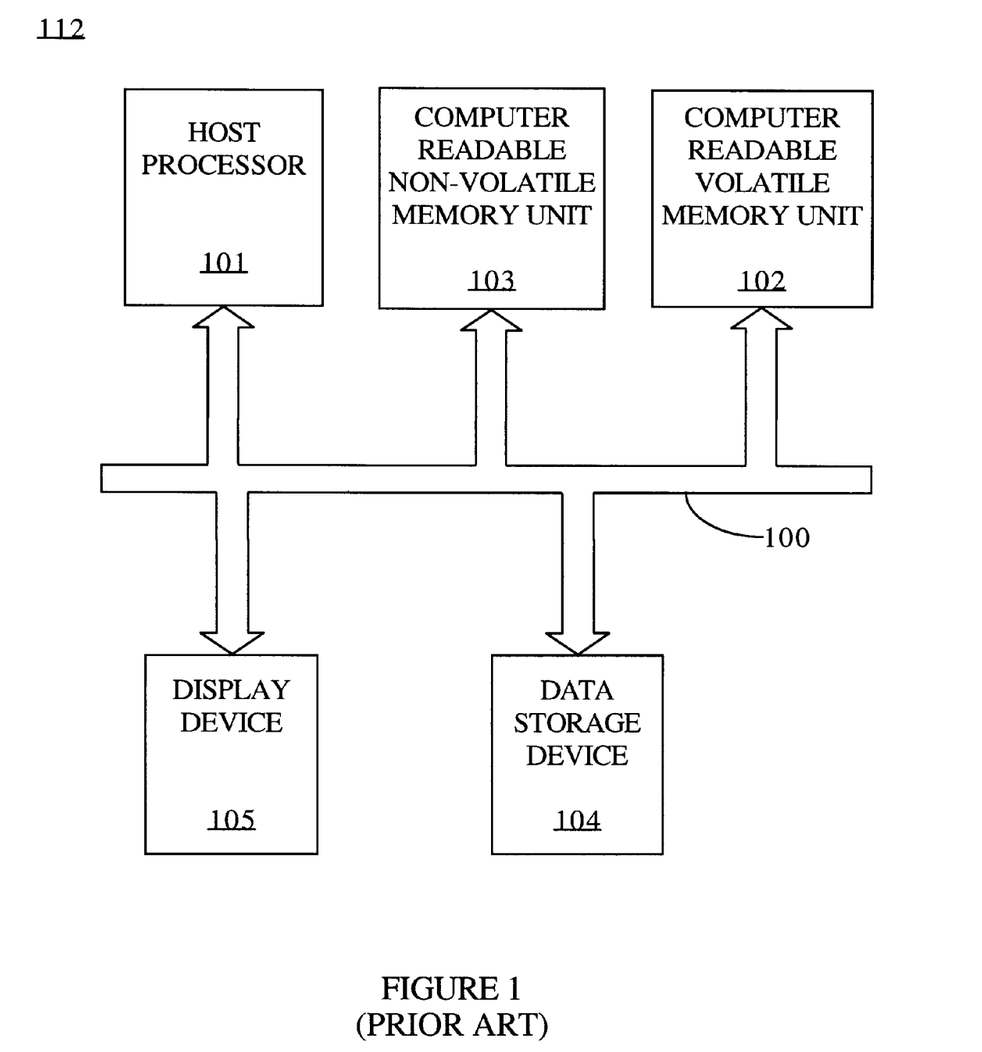
FIG. 1 is a block diagram of an embodiment of a computer system for implementing a simulator for simulating performance of an electronic circuit.

With reference to FIG. 1, a block diagram is shown of a host computer system 112 for implementing a simulator. In general, host computer system 112 for implementing a simulator comprises a bus 100 for communicating information. A host processor 101 is coupled with bus 100 for processing information and commands. A computer readable volatile memory unit 102 (e.g. random access memory unit) is coupled with bus 100 for storing information and commands for host processor 101. A computer readable non-volatile memory unit 103 (e.g., read only memory unit) is coupled with bus 100 for storing static information and commands for host processor 101. A computer readable data storage device 104 such as a magnetic or optical disk and disk drive is coupled with bus 100 for storing information and commands. A display device 105 is coupled to bus 100 for displaying information to the computer user. The display device 105 can be a liquid crystal device, cathode ray tube, or other display device suitable for creating graphic images and alphanumeric characters recognizable to the user. A simulator program and Verilog description of a test bench may be stored in memory units 102, 103 or in memory storage device 104 of host computer system 112.

Figure 2:
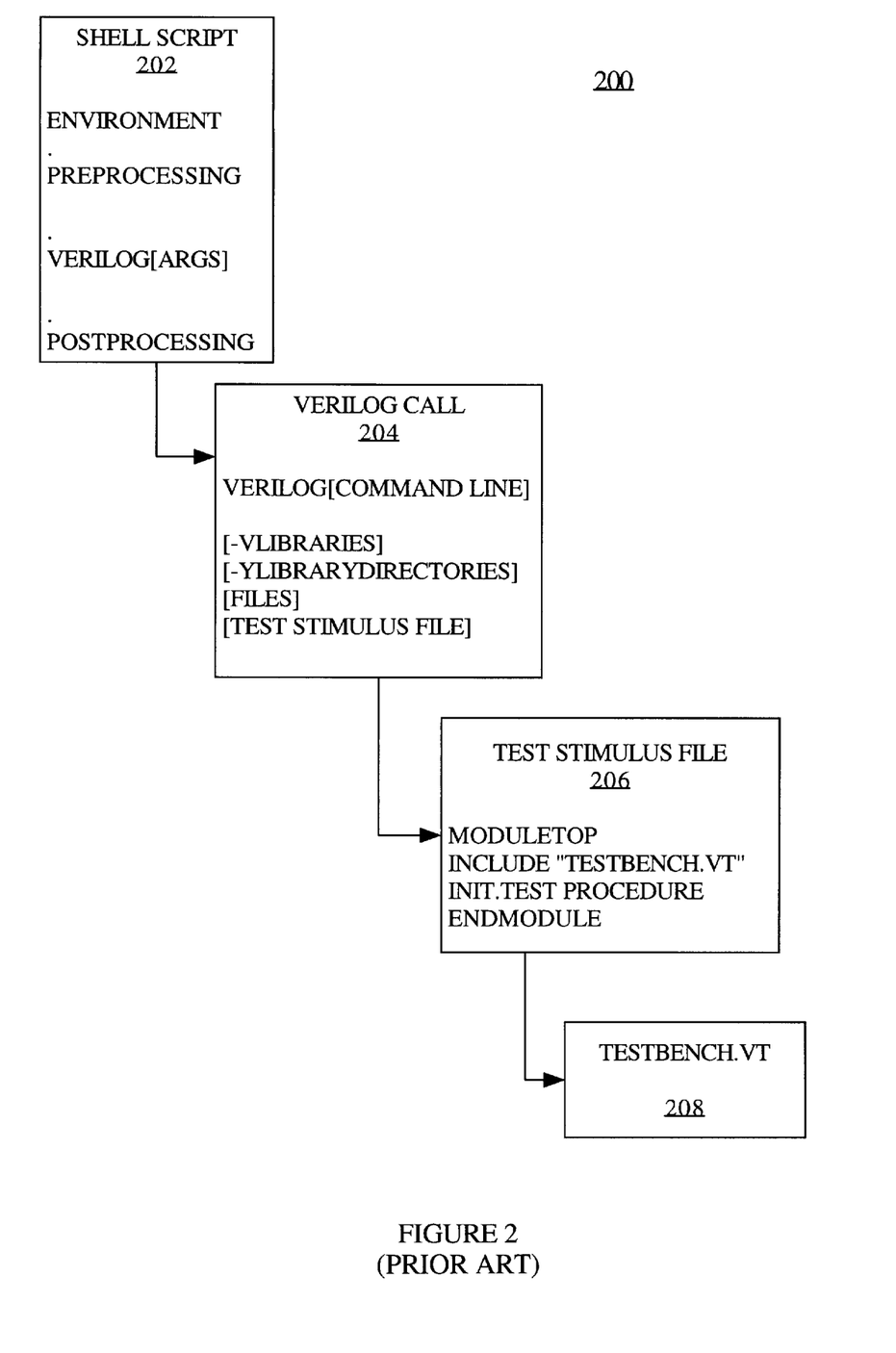
FIG. 2 is a block diagram illustrating file structures for implementing a prior art Verilog simulation process including a shell script, a simulator call, a test stimulus file, and a virtual test bench.

FIG. 2 shows a block diagram illustrating a file structure organization 200 for organizing a virtual test bench according to prior art methods. A shell script 202 typically includes environment files, preprocessing files, simulator command line arguments, and post-processing files. Shell script 202 is used to execute a virtual test bench. Shell script 202 sets environmental variables. A simulator call 204 includes simulator command line arguments executed by shell script 202. Simulator command line arguments typically include library files, library directories, and a test stimulus file 206. Simulator call 204 is used to launch the simulator. Simulator call 204 defines and calls other files including the Verilog libraries and directories. Test stimulus file 206 includes information specific to a test run. Test stimulus file 206 also typically includes a prior art test bench file 208.

Figure 3:
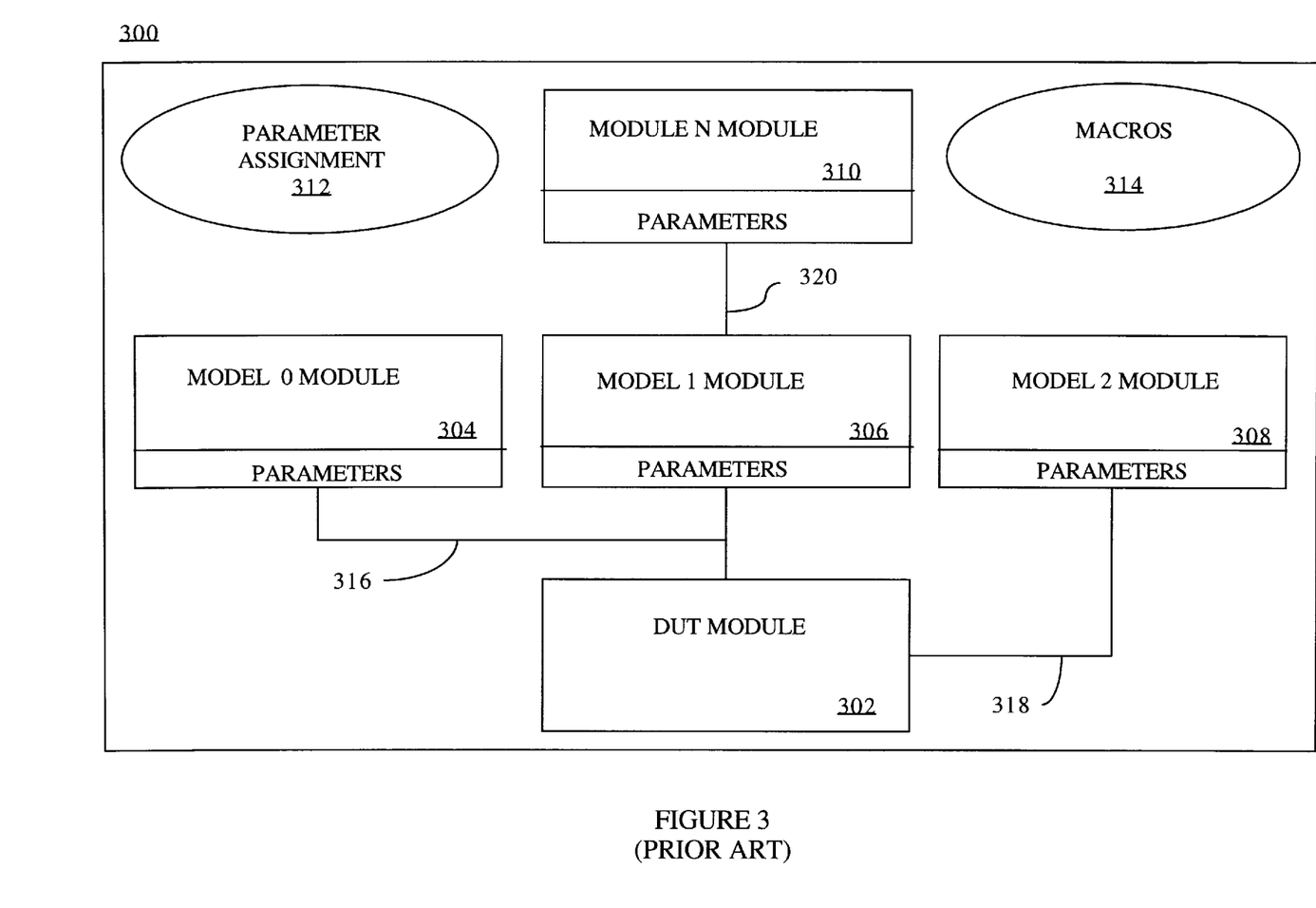
FIG. 3 is a block diagram of a virtual test bench architecture according to a typical prior art method for managing a test bench.

With reference to FIG. 3, a typical prior art virtual test bench 300 is shown. Virtual test bench 300 is instantiated by test stimulus file 206 of Simulator command line 204 (FIG. 2) and executed using shell script 202. Virtual test bench 300 may include an integer number, n+1, of virtual modules 302, 304, 306, 308, and 310 which are used to model structures and functions of simulated devices. Module 302 is a device under test module (DUT module). Module 304 is a model-0 module. Module 306 is a model-1 module. Module 308 is a model-2 module. Model 304 is a model-N module. As examples, each of modules 304, 306, 308, and 310 may be a host memory of a computer system hosting DUT module 302, a PCI bus arbiter of a computer system, or a physical interface for an ethernet chip (a Phy chip).

In virtual test bench 300, modules 302, 304, 306, 308, and 310 are interconnected by interconnections 316, 318, and 320. Interconnection 316 interconnects model-0 module 304, model-1 module 306, and DUT module 302. Interconnection 318 interconnects model-1 module 306 and model-2 module 308. Interconnection 320 interconnects model-N module 310 and model-1 module 306. Each of interconnections 316, 318, and 320 is integral to the Verilog description of test bench 300. In the prior art, interconnections 316, 318, and 320 are created and edited using Verilog syntax only. In order to change interconnections 316, 318, and 320, Verilog test bench files may be edited. Editing Verilog test bench files presents problems because Verilog testbench files are complex and may be located in many different places. For example, DUT module 302 files may be stored in a first directory while files for another module are stored in a second directory.

Each of models 302, 304, 306, 308, and 310 may include Verilog parameters. Parameters are defined locally within models 302, 304, 306, 308, and 310 but may be assigned values from outside of models 302, 304, 306, 308, and 310. Virtual test bench 300 includes a parameter assignment block 312 which configures modes of simulation by setting parameters such as, for example, a virtual memory size or a functional mode which a Phy chip is working in. Virtual test bench 300 may include Verilog macros 314. Verilog macros 314 are a text-substitution facility of the Verilog language. Each macro of Verilog macros 314 is a globally defined entity. A Verilog macro 314 may be defined in any Verilog file and may be referenced by any Verilog file provided that the simulator parses the definition of the Verilog macro 314 before any reference to that Verilog macro 314.

Simulators typically allow for configuring a test bench 208 in many different ways. This allows a user to simulate different design levels, to set model parameters, to connect different models, to define macros, and to select simulators. Typically, many files located in many different directories are used to describe a test bench 208. Each Verilog test bench file typically includes many nested conditional blocks. A test bench 208 defined by a large number of files, each including many nested conditional blocks in the Verilog code, tends to become very difficult to manage.

Verilog does not provide the convenience of grouping a collection of signals together into an entity as is desirable in some cases. A PCI bus is an example of a plurality of signals which may desirably be handled in simulation as a single entity, to facilitate the connection of devices to the bus. It may also be desirable to modify the way different devices connect to the same bus, for example to connect different devices to different slots of the PCI bus. Because typical prior art methods of managing a test bench provide no mechanism for grouping a collection of signals together into an entity, switching an interface of the DUT to a different slot may require extensive editing of many files.

Figure 4:
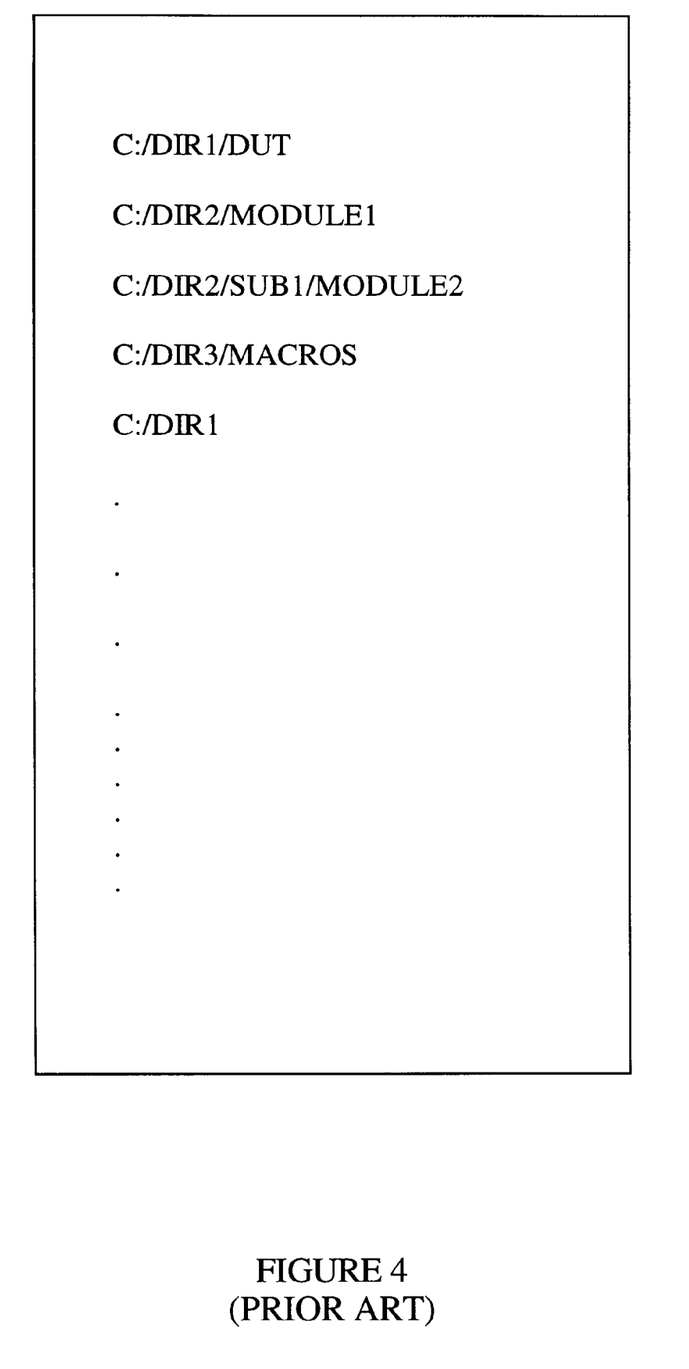
FIG. 4 is a block diagram illustrating test bench files stored in various separate directories according to typical prior art methods for organizing a test bench.

FIG. 4 illustrates an example of files of a virtual test bench stored in separate directories. DUT module model file 302 (FIG. 3) is stored in a first directory. Module1 model file 306 is stored in a second directory. Module2 model file 308 is stored in a first sub directory of the second directory and Verilog macros 314 are stored in a third directory.

In order to change an interconnect 316, it is necessary in the prior art to edit the testbench module. This task typically requires; (1) transferring the testbench file to a local directory from a separate directory where it is stored, and (2) changing arguments in the Simulator command line to point to the new file. To make a change in a file, it is also often necessary to change corresponding argument files including, for example, library files, library directory files, and test stimulus files. Further, it is often necessary to edit certain additional files containing to change pointers.

Typical prior art methods of organizing a test bench require a minimum two or three files to implement a simulation process. Separate files are typically required for stimulus information, shell script information, and macro information. Therefore, transfer of fields from one engineering stage to another may be cumbersome.

What is needed is a method for managing a virtual test bench in which all simulation configuration is controlled at a central point, locally on a command line at run-time. What is also needed is a method for managing a virtual test bench in which configuration is controlled by issuing commands to modify a master setup file, and not by rigorous editing of a master setup file. In addition it would be advantageous to encapsulate a test stimulus file and testbench configuration into a single file because it is necessary to pass a virtual test bench from one stage to another in various phases of simulation construction. What is further needed is a method for managing a virtual test bench in which there is no need for complex editing of multiple components with conditional blocks of code. Finally, it would be advantageous if common configuration options could be reduced to command-line switches.

SUMMARY OF THE INVENTION

In accordance with principles of the present invention, a testbench description language and an object oriented simulation model compiler (OOSM compiler) for parsing the testbench description language are provided. The testbench description language and OOSM compiler act as a preprocessor in an electronic circuit simulation process using a computer implemented simulator. The OOSM compiler receives a test bench description stream including testbench description language commands (TBDL commands) which are native test bench description statements. The OOSM compiler generates output files including a virtual testbench and a test bench script for input to the simulator. By default, the OOSM compiler executes the test bench script after compiling the test bench.

The OOSM compiler processes TBDL commands provided by a plurality of object call generators to form a testbench description stream of commands. Object call generators include at least one setup file. A project set up file defines a baseline project virtual test bench which may be modified by more specific subsequent TBDL commands generated by subsequent set up files. The project setup file also defines command line macros. Command line macros are macros, built using native TBDL statements, which may be called to execute a series of TBDL commands on a compiler command line of the OOSM compiler.macros of the testbench description language reduce the many permutations of a test-bench configuration to a plurality of building blocks. Subsequent TBDL commands may modify or even cancel earlier TBDL commands so that subsequent object call generators have a higher priority than earlier object call generators. Earlier TBDL commands in the testbench description stream are more generic than subsequent TBDL commands. Subsequent TBDL commands are given precedence over earlier TBDL commands.

The OOSM compiler is also receptive to an output of an interface generator. The OOSM compiler generates a test bench master file. The test bench master file includes a plurality of models interconnected by a plurality of interfaces. Each interface is a collection of wire statements. Each of the interfaces includes at least one signal. The OOSM compiler compiles the testbench description stream and interfaces such that a modification to a signal of an interface carries through to each model to which it is connected.

These and other advantages of the present invention will become apparent upon reading the following detailed descriptions and studying the various figures of the drawings.

DETAILED DESCRIPTION OF THE PREFERRED EMBODIMENTS

In accordance with principles of the present invention, a testbench description language and an object oriented simulation model compiler (OOSM compiler) for parsing the testbench description language are provided. The testbench description language and OOSM compiler act as a pre-processor in an electronic circuit simulation process using a Verilog simulator such as Verilog XL or VCS. The testbench description language and OOSM compiler are used to create and manage a virtual test bench.

Figure 5:
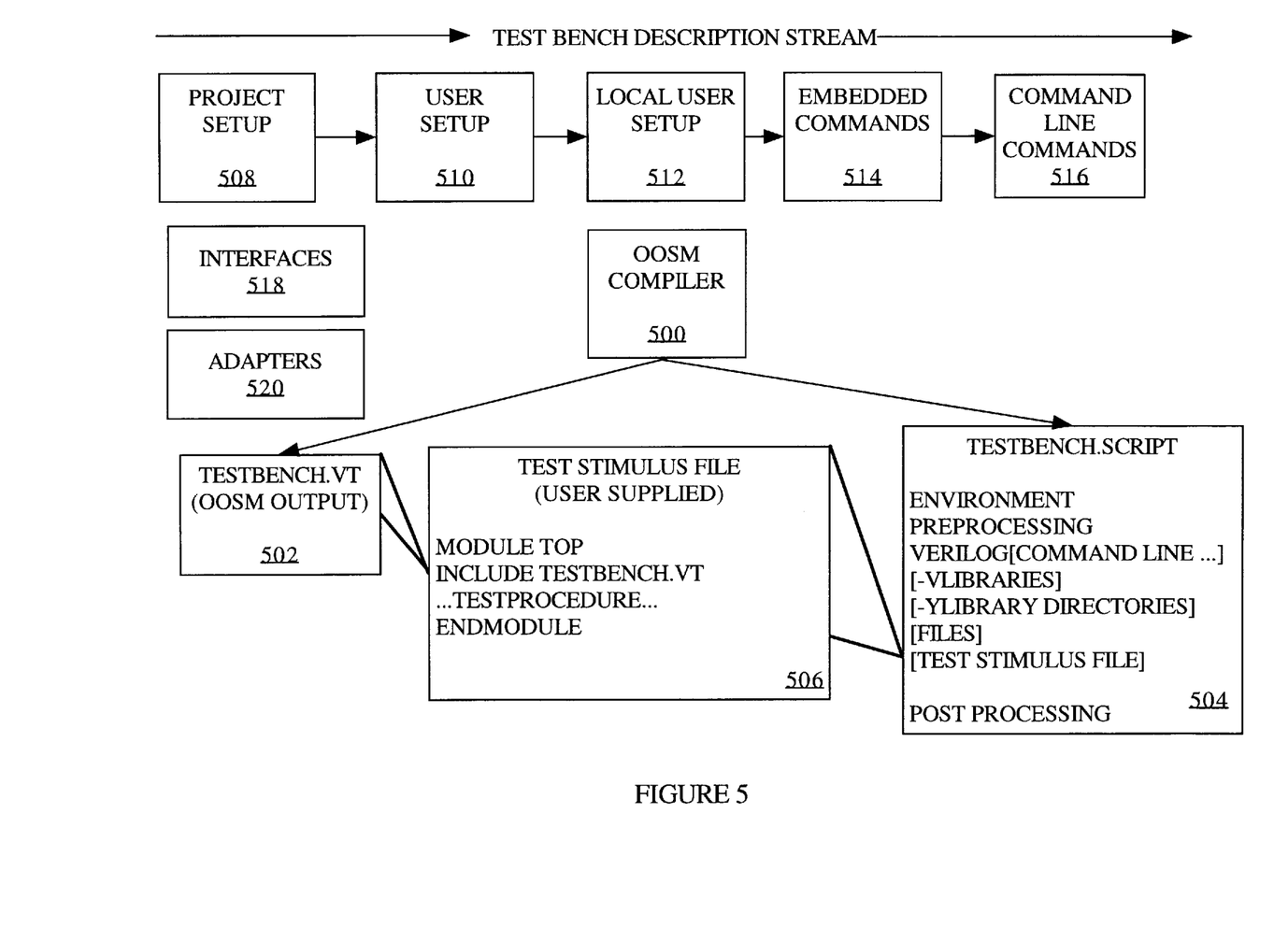
FIG. 5 is a process diagram of an object oriented simulation model compiler (OOSM compiler) for receiving test bench description stream object calls and for generating a test bench and a test bench script in accordance with principles of the present invention.

FIG. 5 shows a block diagram of an object oriented simulation modeling compiler (OOSM compiler) 500 in accordance with principles of the present invention. OOSM compiler 500 receives a test bench description stream, including test bench language commands (TBDL commands) which are native test bench description language commands. TBDL commands are commands for object oriented simulation of an electronic circuit, generated by executing a sequence of object call generators. TBDL commands are parsed by OOSM compiler 500 after being placed on a compiler command line. OOSM compiler 500 generates output files which provide simulator command line entries to a simulator command line.

OOSM compiler 500 outputs a testbench master file 502 and a test bench script 504. Test bench master file 502 and test bench script 504, along with a test stimulus file 506, provide inputs to a simulator such as a Verilog XL simulator or a VCS simulator. The simulator may run normally without modification for receiving outputs of OOSM compiler 500.

In an embodiment of the present invention, test bench file 502 is designated "testbench.vt." Test bench file 502 contains a Verilog description of a testbench generated by OOSM compiler 500. Test bench 502 includes module instantiations of devices under simulation, defined parameters, and wire declarations for interface signals all of which are further explained below. In an embodiment of the present invention, test bench 502 is included in test stimulus file 506 using the Verilog include directive: 'include "testbench.vt"'. Therefore, a statement "include testbench.vt" is included within a top module of test stimulus file 506. Test bench script 504 includes shell script to run a simulation on the simulator. Test bench script 504 also includes test procedural Verilog code for performing a simulation. By default, OOSM compiler 500 executes test bench script 504 after compiling testbench 502. Test bench script 504 uses contents of a Verilog environment variable as the name of the simulator program. If $VERILOG is not defined, OOSM compiler 500 will use "Verilog" as the name of the simulator as a default.

An additional output file, testbench.defines (not shown), is provided by OOSM compiler 500. The testbench.defines file is declared early in the simulation command line so that Verilog macros will be compiled before anything else. This file contains Verilog macros. This file is separate from test bench 502 because test bench 502 is included in test stimulus file 506 which is the last file, not the first, on the simulator command line.

The test bench description language describes how to build test bench script 504 and test bench file 502. The testbench description stream is designed and executed so that subsequent commands may modify or even cancel earlier commands. Therefore, subsequent object call generators of the test bench description language are given precedence over earlier object call generators. For most test bench description language commands, corresponding "undo" commands are also included in the test bench description language. As previously mentioned, the testbench description language includes TBDL commands to place text on a simulator command line.

For Verilog XL and VCS simulators, as with most simulator programs, commands which appear later (to the right) on the command line take precedence over commands which appear earlier (to the left) on the command line. Exceptions to this rule exist for reverse order simulator command line entries as explained further below. Simulator command line entries made later in the testbench description stream take precedence over earlier simulator command line entries.

In an embodiment of the present invention, the testbench description stream is provided by up to five object call generators in sequence to form one long stream of test bench description language commands. Object call generators include a project setup object call generator 508, a user setup object call generator 510, a local user setup object call generator 512, an embedded commands object call generator 514, and a command line commands object call generator 516. Testbench description commands are received sequentially from object call generators 508, 510, 512, 514, and 516 by OOSM compiler 500.

The testbench description language includes macro capability whereby a simple testbench description language command line macro may be defined to execute a sequence of test bench description statements. Ideally, a user, such as a design engineer, is not required to understand the test bench description language. In an embodiment of the present invention, test bench description language command line macros are defined by a verification engineer and placed in a project setup file used to implement project setup object call generator 508. The macros may be used by a user to modify the project test bench. Project setup object call generator 508 provides definitions of all macros provided for users of a testbench.

Because the configuration of a test bench is typically required to be changed many times in the course of a simulation project, it is desirable to have a master file description of the project test bench which may be easily changed incrementally by users. Project setup object call generator 508 defines a default, or baseline, project testbench which is generic.

Test bench description language object call generators subsequent to project setup object call generator 508 include user setup object call generator 510, local user setup object call generator 512, embedded commands object call generator 514, and command line command object call generator 516. Each object call generator subsequent to project setup object call generator 508 may modify the base line project test bench defined by project setup object call generator 508 because subsequent TBDL commands in the test bench description stream take precedence over earlier TBDL commands. User setup object call generator 510 provides TBDL statements particular to a user, and not related to a particular test or group of tests. Local user setup object call generator 512 provides TBDL statements allowing a user to define setup requirements pertaining to a particular directory. Embedded commands object call generator 514, which is contained in stimulus file 506, provides TBDL statements pertaining to one particular simulation test. Command lines command object call generator 516 allows for additional TBDL commands to be given on the compiler command line by a user, along with test stimulus file 506, during compiling by OOSM compiler 500. Command lines command object call generator 516 allows one time modifications to be made to test bench 502.

Interface generator 518 generates interfaces each of which defines a group of signals using Verilog 'wire', 'pullup', and 'pulldown' commands. (See Section 10.2 of Appendix B for a format of an interface file). Interfaces according to principles of the present invention are explained below in detail. Adapter files are used to map device module port names to interface signal names. In an embodiment of the present invention, the format of adapter files is: module_signal= interface signal. A special signal name "NC" may be used on the right side of the equals sign to indicate no connection to that module port. Standard Verilog vector notation may be used on the right side of the equals sign. (See the example adapter file in Section 10.3 of Appendix B).

In an embodiment of the present invention, a simulation environment is modeled in terms of nine basic elements in three groups. A first group of model elements includes instantiation and connection of devices. Devices may include, for example, system models, monitors, and the design under test. Instantiation and connection models include interfaces and devices.

A second group of simulation elements includes a simulator command line. Simulator command line model elements include Verilog libraries, Verilog library directories, Verilog files, and other text on the simulator command line. In embodiments of the present invention, Verilog include directories are indicated by the notation, "+incdir+, on the simulator command line, Verilog libraries are indicated by the notation, -v, on the simulator command line, and Verilog library directories are indicated by the notation, -y, on the simulator command line.

A third group of simulation elements, Verilog compile-time configuration elements, includes Verilog macros (indicated by the notation, 'define) and Verilog parameters (indicated by the notation, defparam).

Figure 6:
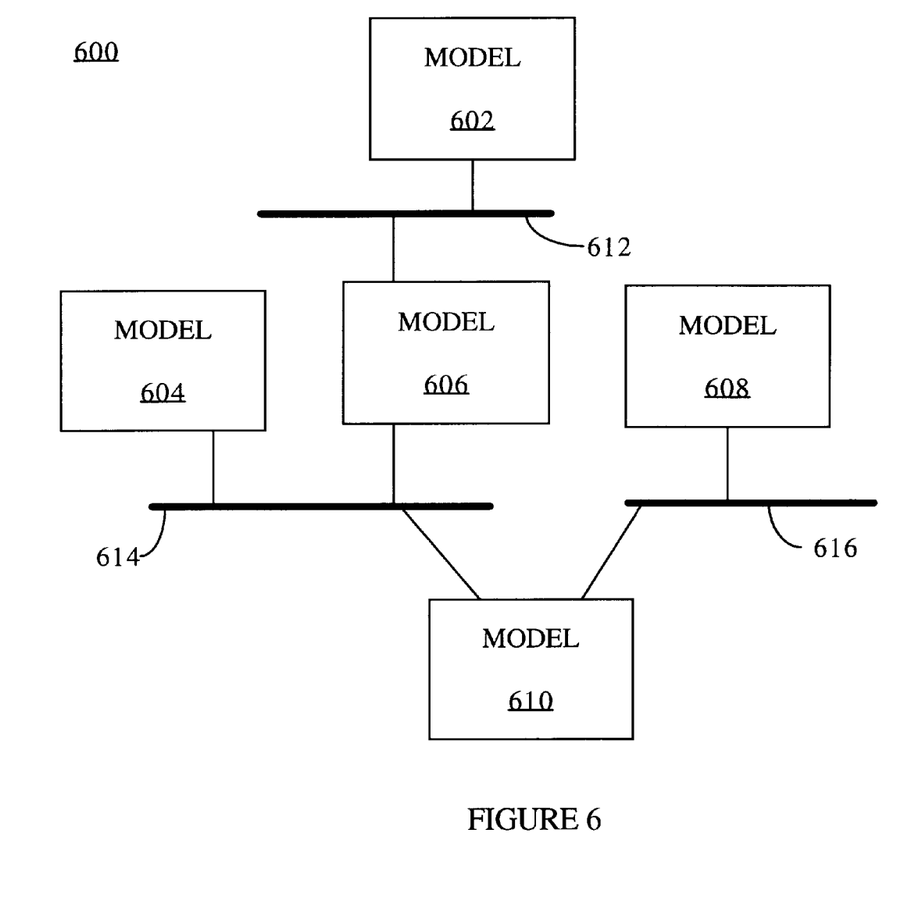
FIG. 6 is a block diagram illustrating a test bench master file including a plurality of models interconnected by a plurality of interfaces file according to principles of the present invention.

FIG. 6 shows a block diagram of a test bench master file 600 in accordance with principles of the present invention. Test bench master file 600 includes a plurality of models 602, 604, 606, 608, and 610 and a plurality of interfaces 612, 614, and 616. In an embodiment of the present invention, each of interfaces 612, 614, and 616 is a collection of Verilog signals, that is a collection Verilog wire statements. Wire statements are globally defined. Each of interfaces 612, 614, and 616 may contain a different set of wires. (See section 8.1 and the sample interface file in Section 10.2 of Appendix B for the format of an interface file).

Each of models 602, 604, 606, 608, and 610 is a module representing a device. In an embodiment of the present invention, each of models 602, 604, 606, 608, and 610 is a Verilog module whose module ports connect to one or more interfaces 612, 614, and 616. Models 602, 604, 606, 608, and 610 may include system models, monitors, and the design under test. Each of models 602, 604, 606, 608, and 610 may connect to one or more of interfaces 612, 614, and 616. (See Section 8.2 and the example project setup file in Section 10.4 of Appendix B for the format of the device command). In the exemplary test bench master file 600, model 606 is coupled to model 604 via interface 614. Model 606 is coupled to model 602 via interface 612. Model 610 is coupled to model 608 via interface 616. Model 610 is coupled to models 606 and 604 via interface 614.

Devices are created in the TBDL using a "device" command and are instantiated inside test bench 502 (FIG. 5) which is required to be included inside the top module of test stimulus file 506. A "device-name" argument of the "device" command is used as an instance name of the instantiation. Therefore, all devices appear hierarchically directly below the top module of test stimulus file 506. In order to access tasks and variables inside devices from within test stimulus file 506, it is only necessary to give a partial path consisting of the device name. For example, if a device is specified using the devicename "pci_slave_model", and if there is a task inside the slave model called "enable_memory(arg)", a user may use the Verilog statement, "pci_slave_ model.enable_memory(0)" to call the task from within the test stimulus module. If interface signal names are not the same as the module port names, a mapping from one to the other is required. The mapping can either be given within the "device" command (see Section 8.2), or it may be contained in an adapter file.

Verilog does not provide the convenience of grouping a collection of signals together into an entity as is desirable in some cases. For example, a PCI bus defines a plurality of signals. It is convenient to encapsulate the plurality of signals defined by a PCI bus into a single entity. For example, a PCI bus may include 6 requests and 6 grants corresponding to six slots in a personal computer (PC), as well as the common signals (address, data, control, etc.) which connect to all devices on the PCI bus. It is desirable to be able to connect, disconnect, and switch a device under test (DUT) between any one of the six slots of the PC. To reconnect the DUT to a different slot using the prior art method of organizing a test bench may require extensive editing of many files.

Interfaces 612, 614, and 616 according to principles of the present invention are collections of signals. In an embodiment of the present invention, an interface is a collection of Verilog wire statements. Interfaces 612, 614, and 616 of the present invention provide an advantage in reconnecting a DUT model of models 602, 604, 606, and 608 to a different slot. For example a first command request, Req=PCI_bus_ Req3, may connect the DUT to a third slot. In the method of the present invention, later requests take precedence over former requests.

An interface syntax for interfaces 612, 614, and 616 is provided in accordance with principles of the present invention. Interfaces are declared inside of test bench 502 (FIG. 5) which is required to be included inside the top module of test stimulus file 506 of FIG. 5. Thus interfaces appear at the same hierarchy level as the test stimulus module. In an embodiment of the present invention, signal names are prepended with the "interface name" of the interface, followed by an underscore. For example, if there is an interface with in interface name of "pci_bus", and if one of the signals in that interface is called "pclk", that signal may be referred to from within the test stimulus module as "pci_ bus_pclk".

Figure 7:
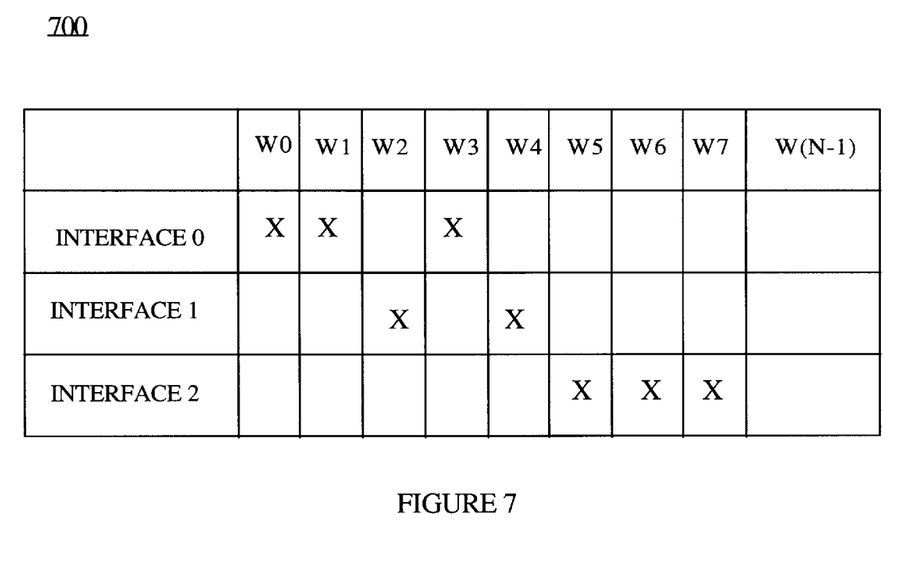
FIG. 7 is a table illustrating Verilog wires included in interfaces of a test bench in accordance with principles of the present invention.

FIG. 7 shows a table 700 illustrating Verilog wires included in interfaces 612, 614, and 616 (FIG. 6) of test bench in accordance with principles of the present invention. Rows of table 700 include interfaces; interface0, interface1, and interface2. Columns of table 700 include wires; W0, W1, W2, ÖW(N−1). An "x" in a column of a particular row indicates that the wire corresponding to the column is included within the interface corresponding to the row.

Figure 8:
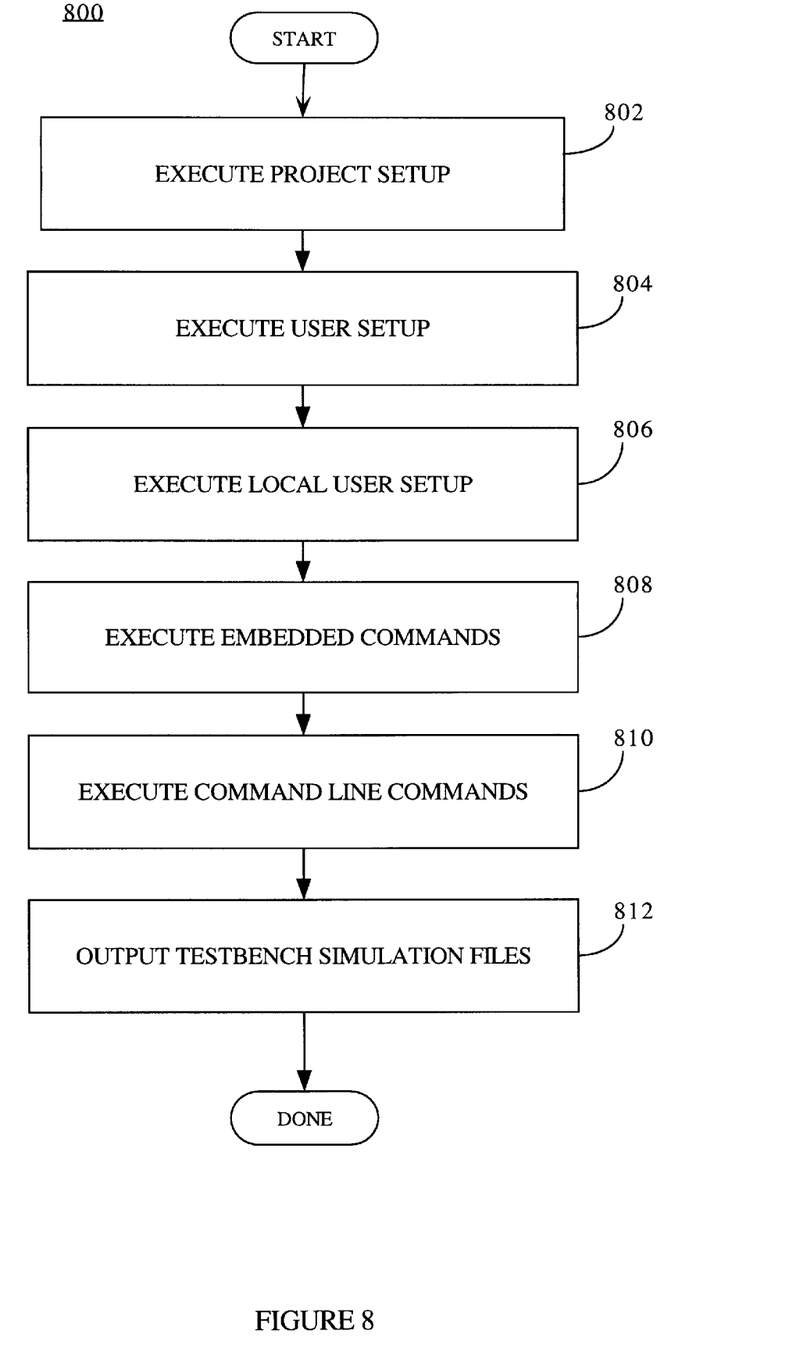
FIG. 8 is a block diagram illustrating sequential execution of a test bench description stream in accordance with principles of the present invention.

FIG. 8 is a block diagram illustrating an execution process 800 of a test bench description stream in accordance with principles of the present invention. In step 802 of process 800, a project setup file is executed to implement project setup object call generator 508 (FIG. 5). The project setup file contains a description of the generic default project testbench configuration. In an embodiment of the present invention, the project setup file is defined by an environment variable called PROJECT_SETUP. If not defined, no project setup file will be processed. The project set up file also contains definitions of the switches described above.

In step 804 of process 800 (FIG. 8), a user setup file is executed to implement user setup object call generator 510 (FIG. 5). The user setup file defines a testbench configuration which is generic for a user. For example, a user may define a favorite search order to search a plurality of simulation machines. In accordance with principles of the present invention, the user setup file is intended to be used to contain TBDL commands which do not affect the outcome of a simulation. This allows test stimulus file 506 to be portable from user to user without dependence on the user setup file. However, OOSM compiler 500 doesn't treat commands in the user setup file any differently than any other commands in the TBDL description stream. That is, OOSM compiler 500 does not prevent the user setup file from being misused. The user setup file is defined by an environment variable called USER_GLOBAL_SETUP. Typically, it will be defined as ~/ictest.setup. If not defined, no user setup file will be processed.

In accordance with step 806 of process 800, a local user setup file is executed to implement local user setup object call generator 512. The local user setup file allows for a user having setup requirements pertaining to a particular directory. Users may organize their stimulus files into directories of tests requiring similar test bench configuration. Test specific configurations may be maintained in the local user setup file while creating tests. As tests mature, TBDL commands can be moved from the local user setup file to the stimulus file, so that the stimulus file can be handed from user to user with no hidden dependencies. In an embodiment of the present invention, testbench description statements pertaining to a directory may be kept in a file called ./ictest.setup. While it is convenient to keep statements in the ./ictest.setup file which affect the output of the simulation, it is a beneficial to merge all test-specific statements from ./ictest.setup into test stimulus file 506 before releasing them so that test stimulus file 506 does not depend on any other file. In an embodiment of the present invention, the local user setup file is pointed to by an environment variable USER_SETUP, typically set to ./ictest.setup. If not defined, no user local setup file will be processed.

In step 808 of process 800, embedded commands are executed to implement embedded commands object call generator 514 (FIG. 5). The embedded commands include test bench description statements pertaining to a particular simulation test run. In an embodiment of the present invention, test bench description statements of the embedded commands are embedded in test stimulus file 506. For every comment line inside test stimulus file 506 of the form //TESTBENCH (note: no space between // and TESTBENCH), OOSM compiler 500 will interpret the remainder of the line as test-bench description statements. Alternatively, testbench description statements may be contained between two special comment lines: /*TESTBENCH_ON and TESTBENCH_OFF*/.

OOSM compiler 500 includes one mandatory command-line argument; a name of test stimulus file 506. Test stimulus file 506 is the only file which is parsed for embedded testbench description statements. Embedding all test-specific testbench description statements in test stimulus file 506 allows easy transfer of test files from user to user. All information needed to build testbench 502 and execute a simulation may be contained in a single file.

In step 810 of process 800, TBDL commands are executed on the compiler command line to implement command line commands object call generator 516 (FIG. 5). Command lines allow for additional TBDL commands to be given on the compiler command line, along with test stimulus file 506, during compiling by OOSM compiler 500.

Earlier TBDL commands, such as those generated by project setup object call generator 508, are more generic. Subsequent TBDL commands, such as those generated by embedded commands object call generator 516, are intended as modifications to the generic project setup file and so are given precedence.

As previously mentioned, the simulator command line is built from left to right and commands which appear later (to the right) on the simulator command line take precedence over commands which appear earlier (to the left) on the simulator command line. However, reverse order simulator command line elements are specially handled by OOSM compiler 500 because reverse order simulator command line elements, including simulator command line elements, take precedence from right to left on the command line. Reverse order Verilog command line elements include libraries and library directories. Libraries which appear earlier on the command line are scanned first and therefore take precedence over libraries which appear later on the command line. In order for OOSM compiler 500 to give precedence to the later TBDL commands over earlier TBDL commands, OOSM compiler 500 treats reverse-order entities specially. Specifically, OOSM compiler 500 places simulator command line switches for later TBDL commands earlier on the simulator command line. Verilog library and Verilog library directory commands are placed on the simulator command line using the special TBDL commands for those elements (Verilog_library, Verilog_library_directory, Verilog_incdir), and not the generic Simulator command line command (Simulator_command_line).

Verilog macros are handled specially by the compiler for a number of reasons. One reason is the ambiguity of macro definition, owing to the fact that verilog macros can be defined on the simulator command line or within define statements. Another is a syntactic conflict encountered when trying to place arbitrary text on the command line, which is parsed multiple times by the shell. OOSM compiler 500 places all macro definitions in 'define statements inside test bench 502 (FIG. 5). By handling macros specially, OOSM compiler 500 may remove redefinitions of macros. While it may be desirable to redefine a macro in the testbench description, it is not desirable for the simulator to warn about it. When OOSM compiler 500 encounters a redefinition of an existing macro, it eliminates the 'define for the previous definition before running the simulation.

Verilog macros are kept in a testbench defines file, because all Verilog macro defines must be compiled by the simulator before they are used. The rest of the testbench description, in test bench 502, must appear at the end of the simulator command line. Verilog parameters are handled by OOSM compiler 500 similarly to macros, except the resultant defparam statements appear in test bench 502 (FIG. 5) instead of in a special file. In general, parameters are much easier to use than Verilog macros. Parameters are localized, whereas macros are global. The Verilog language imposes far fewer errors on parameters than on macros. OOSM compiler 500 can handle macros or parameters, but the Verilog language makes parameters far preferable to macros in nearly all cases.

In step 812, to which process 800 proceeds from step 810 (FIG. 8), OOSM compiler 500 (FIG. 5) outputs test bench simulation files including test bench 502 and test bench script 504.

Figure 9A:
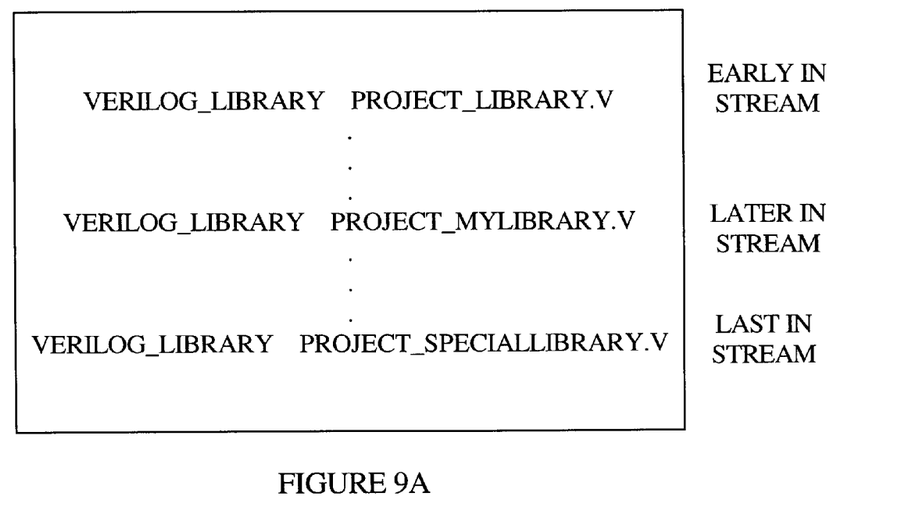
FIG. 9A is a block diagram illustrating progressive modifications of a Verilog test bench project library as a test bench description stream is executed according to principles of the present invention.

FIG. 9A is a block diagram illustrating progressive modifications of a Verilog test bench project library as a test bench description stream is executed. Additional libraries can either be substitutions for existing libraries, or additional libraries. In all cases, libraries specified later in the TBDL stream will be scanned by the simulator first. In this example, early in the test bench description stream, a project library, PROJECT_LIBRARY.V, is defined. Later in the test bench description stream, the Verilog test bench project library, PROJECT_LIBRARY.V, is added. PROJECT_MYLIBRARY will be scanned first by the simulator. If PROJECT_MYLIBRARY contains cells which are also contained in PROJECT_LIBRARY.V, the cells contained in PROJECT_MYLIBRARY.V will be used. Last in the testbench description stream, the library PROJECT_SPECIAL_LIBRARY.V is added. The simulator will scan the libraries in the order; PROJECT_SPECIAL_LIBRARY.V, PROJECT_MYLIBRARY.V, PROJECT_LIBRARY.V.

Last in the test bench description stream, the Verilog test bench project library, PROJECT_MYLIBRARY.V, is modified to create a library PROJECT_SPECIAL LIBRARY.V.

Figure 9B:
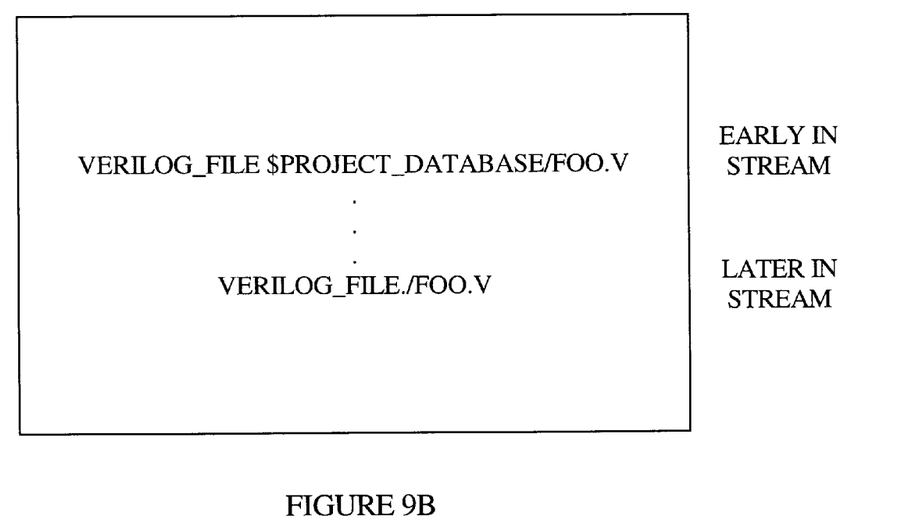
FIG. 9B is a block diagram illustrating progressive modifications of a Verilog test bench master file as a test bench description stream is executed according to principles of the present invention.

FIG. 9B is a block diagram illustrating progressive modifications of a Verilog test bench project file as the test bench description stream of FIG. 5 is executed. Early in the test bench description stream, a Verilog source file, PROJECT_DATABASE/FOO.V is defined. Later in the test bench description stream, the Verilog test bench project file, PROJECT_DATABASE/FOO.V, is modified to create a Verilog file VERILOG_FILE./FOO.V.

OOSM Command Line Syntax:

The syntax of a OOSM command is; ictest [commands|switches] <test_stimulus_file> [switches]. OOSM commands are native testbench description language statements and macros built using native language statements. Macros always begin with a '−'. Commands never begin with a '−'. All commands must appear before the test stimulus filename. The test stimulus filename is required. Macros may appear before or after the test stimulus filename.

Testbench Description Language:

There are no command delimiters in the testbench description language (such as semicolons in C or Verilog). Statement boundaries are determined by syntax. Tokens may be separated by any white space, including a new line. Commands may span lines, and multiple commands can appear on the same line.

Two comment forms are supported: comments delineated by /**/, and comments which extend from // to the end of the line.

Interface:

A command, interface <interfacename><filename>, creates an interface defined in <filename>. A name <interfacename> is assigned to this interface.

The file named in <filename> must contain zero or more Verilog 'wire' statements, and/or 'pullup' and/or 'pulldown' statements.

Device:

A device command is stated below.

device<devicename><interfacename><modulename>
  <filename>
[module_signal=inteface_signal . . . ]
[adapter<adapter_filename>
device<devicename><interfacename>
[module_signal=inteface_signal . . . ]
[adapter<adapter_filename>]
device<devicename>
[module_signal=inteface_signal . . . ]

For the first syntax, instantiate the Verilog module defined in module<modu-lename> located in Verilog file <filename>. Connect the device to interface <interfacename> and give this device the name <devicename>.<devicename> is also used as the instance name of the instantiated device module. By default, module ports are connected to interface signals of the same name. Optionally, module port names can be mapped to interface signal names using the [module_signal=interface_signal] syntax, or the mapping may be contained in a file, called an adapter file, using the [adapter<adapter_filename>] syntax. Either or both mapping syntax may be used.

The second syntax is the same as the first, except it does not specify the module name or the file name. This syntax is used to connect a previously defined device to an additional interface.

The third syntax does not specify the interface. This syntax is used to connect signals in a previously-defined device to any interface signal.

Verilog_File

A command, Verilog_file, causes<filename> to be added to the simulator command line. Filenames added using Verilog file appear on the simulator command line after all the Simulator_command_line text, after testbench.defines, after the libraries, after the library directories, and before the test stimulus filename (which appears at the end).

If the base name of<filename> appeared in a previous Verilog_file com-mand, possibly with a different directory path, the previous occurrence is deleted from the simulation command line, and the new one is used.

Verilog_file_file:

A command, Verilog_file_file <filename>, is similar to Verilog_file, except <filename> contains a list of filenames, each of which is added to the simulation command line as in the Verilog_file command.

Verilog_library

A command, Verilog_library <filename>, causes a string of the form "−v <filename" to be added to the simulation command line. Libraries are added to the command line after all the Simulator_command_line text, and after testbench.defines. Library files are added to the command line in reverse order of which they appear in the test-bench description stream. In this way, Verilog_library commands appearing later in the stream take precedence over Verilog_library commands appearing earlier in the stream.

Verilog_library_directory

A command, Verilog_library_directory <directoryname>, causes a line of the form "−y directoryname" to be added to the simulation command line after all −v lines, and before any Verilog filenames. Library directories are added to the command line in reverse order of which they appear in the testbench description stream. In this way, Verilog_library_directory commands appearing later in the stream take precedence over Verilog_library_directory commands appearing earlier in the steam.

Verilog_incdir:

A command, Verilog_incdir <directoryname>, causes a line of the form "+incdir+directoryname" to be added to testbench.script. Incdirs are added to the command line in reverse order of which they appear in the testbench description stream. In this way, Verilog_incdir commands appearing later in the stream take precedence over Verilog_incdir commands appearing earlier in the steam.

Simulator_command_line

A command, simulator_command_line "text . . . ", places "text . . . " (minus the quotes) on the simulator command line. "text . . . " may contain white space. If quotes are desired within the text, use \". Text will be added to the simulator command line from left to right, before any files, libraries, or library directories. There is no check for duplication, and it is assumed the commands placed further right on the simulator command line take precedence over commands placed further left on the simulator command line, when there is a conflict.

define_parameter

Define parameter command is stated below.

define_parameter <devicename.parametername>= <value> define_parameter <modulename.parametername>= <value>

The define parameter commands create a defparam statement inside of testbench.vt. If a device name is given, the left side of the defparam statement is computed by the compiler, based on it's knowledge of the device's module name and where it appears in the hierarchy. If the <modulename.parametername> form is used, <modulename> can be any hierarchical Verilog path name to a module. For relative paths, the starting module is the top module of the test stimulus file. If quotes appear in <value>, the quotes will be part of the parameter definition.

define_Verilog_macro define_Verilog_macro <macroname>=<value>

This command causes a line of the form "`define <macroname><value>" to be added to testbench.defines, which is the first Verilog file specified on the simulation command line in testbench.script. If <macroname> has been defined by a previous define_Verilog_macro command, the newer command erases the older one. There is no syntax to define a macro without giving it a value. If the value of a macro is not important, it can be given any value. (0, for example).

include_in_testbench

A command, include_in_testbench <filename>, adds a line of the form "`include "filename" "in testbench.vt define_env define_env <environment_variablename>=<value>

This command causes a line of the form "setenv <environment_variablename> <value>" to be added to testbench.script, before invocation of the simulator. (Note: testbench.script is a csh script). Environment variable declarations are added from top to bottom, so that later statements in the testbench description stream take precedence.

pre_script

A command, pre_script "text . . . " places "text . . . " (minus the quotes) in testbench.script, before invocation of the simulator, and after all setenv's generated by define_env. If quotes are desired inside of "text . . . ", use \".

post_script

A command, post_script "text . . . " places "text . . . " (minus the quotes) in testbench.script, after invocation of the simulator. If quotes are desired inside of "text . . . ", use \".

setup_file

A command, setup_file <filename> causes the testbench description language statements to be read from <filename>.

define_tbdl_macro

In a command, define_tbdl_macro <-name[(arguments . . . )]> "definition . . . ", "definition . . . " is one or more testbench description language statements. The name of the macro (<-name>) must begin with a "-". After a macro is defined, any appearance of the macro within the testbench description stream is replaced with "definition . . . " (minus the quotes). If quotes are desired within the definition, use \".

The macro can optionally have arguments. The definition of the arguments works similarly to macros in C. An argument list is given. Wherever an argument name appears in the "definition . . . ", it is replaced with the value given to that argument when the macro is invoked.

Undo Commands

In addition, there are several "undo" commands which can be used to undo later in the testbench description stream things which were done earlier in the testbench description stream. There is never any penalty or message if there is nothing to undo.

_nodevice <devicename>

_no_define_Verilog_macro <macroname>

_no_simulator_command_line "text . . . "

_no_Verilog_library <filename>

(only the basename of the file is required, the path is ignored)

_no_Verilog_file <filename>

(only the basename of the file is required, the path is ignored)

_no_include_in_testbench <filename>

(only the basename of the file is required, the path is ignored)

While this invention has been described in terms of several preferred embodiments, there are alterations, permutations, and equivalents which fall within the scope of this invention. It should also be noted that there are may alternative ways of implementing both the process and apparatus of the present invention. It is therefore intended that the following appended claims be interpreted as including all such alterations, permutations, and equivalents as fall within the true spirit and scope of the present invention.

The Appendix in the file will not be printed. It is placed in file for record.

What is claimed is:

1. A process for object oriented simulation modeling for electronic circuits comprising:

executing at least one setup file for object oriented simulation of an electronic circuit wherein the execution of said setup file creates a plurality of object calls, and wherein subsequent object calls take precedence over earlier object calls using said at least one object call to create a plurality of models interconnected by a plurality of interfaces, each having a plurality of parameters within a master file in a computer directory such that a modification to a parameter of an interface carries through to each model to which it is connected within said master file, and executing a testbench simulator that uses said master file to simulate the operation of electronic circuitry.

2. A process for object oriented simulation modeling for electronic circuits as recited in claim 1 wherein the execution of said setup file creates a plurality of object calls, and wherein subsequent object calls take precedence over earlier object calls.

3. A process for object oriented simulation modeling for electronic circuits as recited in claim 1 further comprising executing at least one command for object oriented simulation of an electronic circuit after executing said setup file, said executing at least one command creating at least one object call, where subsequent object calls take precedence over earlier object calls.

4. A process for object oriented simulation modeling for electronic circuits as recited in claim 3 further comprising executing a plurality of commands for object oriented simulation of an electronic circuit after executing said setup file to create a plurality of object calls, where subsequent object calls take precedence over earlier object calls.

5. A process for object oriented simulation modeling for electronic circuits as recited in claim 1 further comprising storing said master file in a single directory of read/write memory of a computer system.

6. A computer readable media comprising computer-executable program commands for implementing the process of claim 1.

7. An object oriented simulation modeler for electronic circuits comprising:

means for executing at least one setup file for object oriented simulation of an electronic circuit to create at least one object call;

means for creating a master file in a directory including a plurality of models interconnected by a plurality of interfaces, each of said plurality of interfaces having at least one parameter, where said plurality of models and said plurality of interfaces were created using said at least one object call, such that a modification to a parameter of an interface carries through to each model to which it is connected; and means for executing a testbench simulator that uses said master file to simulate the operation of electronic circuitry.

8. An object oriented simulation modeler for electronic circuits as in claim 7 wherein said means for executing at least one setup file creates a plurality of object calls and wherein subsequent object calls take precedence over earlier object calls.

9. An object oriented simulation modeler for electronic circuits as in claim 8 wherein said means for executing at least one setup file includes means for executing a plurality of setup files to create said plurality of object calls to create said plurality of object calls and wherein subsequent object calls take precedence over earlier object calls.

10. An object oriented simulation modeler for electronic circuits as in claim 7 further comprising means for executing at least one command for object oriented simulation of an electronic circuit after executing said setup file, said means for executing at least one command creating at least one object call, where subsequent object calls take precedence over earlier object calls.

11. A process for object oriented simulation modeling for electronic circuits as recited in claim 7 further comprising means for executing a plurality of commands for object oriented simulation of an electronic circuit after executing said setup file to create a plurality of object calls, where subsequent object calls take precedence over earlier object calls.

12. An object oriented simulation modeler for an electronic circuit comprising:

a sequence of object call generators creating, as an output, a plurality of object calls, where later object calls take precedence over earlier object calls created by the object call generators;

an interface generator having an output;

a compiler receptive to said output of said sequence of object call generators and to said output of said interface generator, said compiler producing a master file including a plurality of models interconnected by a plurality of interfaces, each of said interfaces having at least one parameter, such that a modification to a parameter of an interface carries through to each model to which it is connected; and a testbench simulator that uses said master file to simulate the operation of electronic circuitry.

13. An object oriented simulation modeler for an electronic circuit as in claim 12 wherein said sequence of object call generators includes a project setup file defining a baseline project test bench and wherein said project setup file includes switches which define macros of a test bench description language for executing a series of test bench description commands.

14. An object oriented simulation modeler for an electronic circuit as in claim 12 wherein said interface generator generates a plurality of Verilog wire statements.

15. An object oriented simulation modeler for an electronic circuit as in claim 12 wherein said compiler parses a test bench description language.

16. An object oriented simulation modeler for an electronic circuit comprising:

a sequence of object call generators creating, as an output, a plurality of object calls, where later object calls take precedence over earlier object calls created by the object call generators; wherein said sequence of object call generators includes:

a project setup object call generator defining a baseline project test bench, said project setup object call generator further defining switches which define macros of a test bench description language for executing a series of test bench description commands;

a user setup object call generator defining test bench description statements particular to a user;

a local user setup object call generator defining test bench description statements particular to a directory;

an embedded commands object call generator including test bench description commands embedded in a test stimulus file; and a command line object call generator allowing for test bench description language commands to be placed on a command line of said compiler;

an interface generator having an output:

a compiler receptive to said output of said sequence of object call generators and to said output of said interface generator, said compiler producing a master file including a plurality of models interconnected by a plurality of interfaces, each of said interfaces having at least one parameter, such that a modification to a parameter of an interface carries through to each model to which it is connected; and a testbench simulator that uses said master file to simulate the operation of electronic circuitry.

17. A process for object oriented simulation modeling for electronic circuits comprising:

compiling a test bench description language to produce simulation source files and simulation scripts to implement a test bench described in said test bench description language, said simulation source files and simulation scripts creating at least one object call; and using said at least one object call to create a plurality of models interconnected by a plurality of interfaces each having a plurality of parameters within a master file in a computer directory such that a modification to a parameter of an interface carries through to each model to which it is connected within said master file.

18. A process for object oriented simulation modeling for electronic circuits as recited in claim 17 further comprising:

executing a testbench simulator that uses said master file to simulate the operation of electronic circuitry.

19. A process for object oriented simulation modeling for electronic circuits as recited in claim 17 wherein the execution of said setup file creates a plurality of object calls, and wherein subsequent object calls take precedence over earlier object calls.

20. A process for object oriented simulation modeling for electronic circuits as recited in claim 17 further comprising executing at least one command for object oriented simulation of an electronic circuit after executing said setup file, said executing at least one command creating at least one object call, where subsequent object calls take precedence over earlier object calls.

* * * * *